United States Patent
Pogorelik

(10) Patent No.: US 9,800,220 B2
(45) Date of Patent: Oct. 24, 2017

(54) AUDIO SYSTEM WITH NOISE INTERFERENCE MITIGATION

(71) Applicant: INTEL CORPORATION, Santa Clara, CA (US)

(72) Inventor: Oleg Pogorelik, Lapid (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/495,167

(22) Filed: Sep. 24, 2014

(65) Prior Publication Data

US 2016/0086619 A1    Mar. 24, 2016

(51) Int. Cl.
*H03G 3/20* (2006.01)
*H03G 3/32* (2006.01)
*G10L 21/0316* (2013.01)

(52) U.S. Cl.
CPC ............ *H03G 3/32* (2013.01); *G10L 21/0316* (2013.01)

(58) Field of Classification Search
CPC .. H04R 1/1041; H04R 1/1091; H04R 1/1083; H04R 2201/107; H04R 2460/01; H04R 2217/03; H04R 3/005; H04R 2205/021; H04R 2420/07; H04R 2499/11; H03G 7/08; H03G 3/32; H10K 15/02; G10L 21/034; H04M 1/21; H04M 1/215; H04M 1/58; H04M 1/60; H04M 1/6016; H04M 1/585; H04M 1/6008; H04M 1/72; H04M 1/725; H04M 9/08; H04M 11/06; H04M 3/51; H04M 3/60; H04M 3/5166; H04M 3/40; H04M 3/002

USPC ....... 381/57, 56, 28, 61, 104, 105, 106, 107, 381/108, 109, 110, 120, 121, 119, 118, 381/334; 379/388.03, 391, 392, 395, 379/390.01, 390.03, 93.21, 158, 202.01, 379/20, 5.01; 455/136, 138, 219, 239.1,
(Continued)

(56) References Cited

U.S. PATENT DOCUMENTS

2004/0174989 A1* 9/2004 Michaelis ........... H04M 1/6016
   379/391
2004/0242160 A1* 12/2004 Ichikawa .............. H04M 1/585
   455/67.13
(Continued)

OTHER PUBLICATIONS

International Search Report and Written Opinion from related PCT Application PCT/US2015/047853 mailed Nov. 27, 2015.
(Continued)

*Primary Examiner* — Leshui Zhang
(74) *Attorney, Agent, or Firm* — Grossman, Tucker, Perreault & Pfleger, PLLC

(57) ABSTRACT

Generally, this disclosure provides systems, devices, methods and computer readable media for an audio device with noise interference mitigation capability. The audio device may include an interference detection module to detect an interfering voice audio signal received from an interfering audio source. The device may also include an interference identification module to identify the interfering audio source. The device may further include an impact estimation module to estimate an impact of the interfering voice audio signal on a user of the audio device and a communication module to transmit a volume correction request to the interfering audio source. The volume correction request may be based on the identification and the estimated impact. Other embodiments may be described and claimed.

10 Claims, 8 Drawing Sheets

(58) Field of Classification Search
USPC ......... 455/240.1, 245.1, 247.1, 250.1, 251.1, 455/3.01, 124, 198.1; 700/94
See application file for complete search history.

(56) References Cited

U.S. PATENT DOCUMENTS

| | | |
|---|---|---|
| 2006/0023061 A1 | 2/2006 | Vaszary et al. |
| 2008/0076431 A1* | 3/2008 | Fletcher ................ G01S 5/0205 455/440 |
| 2010/0035593 A1 | 2/2010 | Franco et al. |
| 2010/0080374 A1 | 4/2010 | Hepworth et al. |
| 2010/0105331 A1* | 4/2010 | Buehler ................... H04B 5/02 455/41.3 |
| 2012/0140949 A1 | 6/2012 | Chen et al. |
| 2014/0010377 A1 | 1/2014 | Hsu et al. |

OTHER PUBLICATIONS

International Preliminary Report on Patentability from related Application PCT/US2015/047853 dated Mar. 28, 2017.

* cited by examiner

| Source ID 502 | Volume 504 | Persistence 506 | Estimated Location 508 | Estimated Proximity 510 | Calculated Impact 512 | Broadcast ID 514 | Reported Location 516 |
|---|---|---|---|---|---|---|---|
| 1 | 50% | 40% | ~x1, ~y1 | 2 | 67 | PC-1 | x1, y1 |
| 2 | 10% | 70% | ~x2, ~y2 | 7 | 11 | PC-2 | x2, y2 |
| 3 | 56% | 33% | ~x3, ~y3 | 4 | 24 | Phone-7 | x3, y3 |

AUDIO SYSTEM WITH NOISE INTERFERENCE MITIGATION

FIELD

The present disclosure relates to audio systems, and more particularly, to audio systems with capability for noise interference mitigation.

BACKGROUND

Audio and video conferencing is becoming increasingly popular as an efficient method for people at different remote locations to collaborate on projects. Office, or other workplace environments, may often include relatively large numbers of workers, each at a desk in an open space area, and each with an audio system or device for conversing with other parties. These workers (device users) may be situated relatively close to each other, with little or no acoustic insulation between them. Unfortunately, groups of people working in close proximity and engaging in concurrent calls or conference calls generally create interfering noise that distracts and disturbs their neighboring workers.

Existing solutions to this problem tend to focus on noise isolation techniques that are implemented to assist a particular user, while leaving other neighboring users to cope with the situation on their own. As a result, many of the parties involved (the neighboring users) typically try to speak louder which exacerbates the problem. Noisy environments may degrade working conditions and result in loss of productivity. Other solutions attempt to address the problem with audio headsets that include relatively complex systems (for example, noise cancelling headphones) which may be expensive to provide to every user and which are generally not effective, particularly at higher audio frequencies.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

FIG. 5 illustrates a table of interfering sources consistent with another example embodiment of the present disclosure;

Although the following Detailed Description will proceed with reference being made to illustrative embodiments, many alternatives, modifications, and variations thereof will be apparent to those skilled in the art.

DETAILED DESCRIPTION

Generally, this disclosure provides systems, devices, methods and computer readable media for an audio system with noise interference reduction capability. The audio system may include multiple audio devices that are in communication with each other through any suitable mechanism including, for example, peer to peer networking. The audio devices may be any type of phone or voice receiving device, such as, for example, an audio/video conferencing or teleconferencing device. The noise interference may include environmental noise, such as, for example, voices of users of the other audio devices that are in relatively close acoustic proximity to each other and/or to the user of the present device.

The audio devices may include an interference processing module configured to detect and identify interfering audio sources, for example from among the one or more other audio devices associated with neighboring users. A correction request signal may then be transmitted to the identified interfering audio source device. The audio devices may further include a voice correction module configured to provide an echo feedback to the user of the device (e.g., the user generating the interfering audio). The amplitude of the echo feedback may be controlled by the correction request signal to induce the user who is generating the interfering audio to lower his/her voice. The correction request may be updated as the user's voice volume is lowered such that the echo feedback is reduced and/or eventually eliminated, resulting in an improved work environment where each audio device user speaks at a volume that reduces noise interference at the neighboring audio device user.

Figure 1:
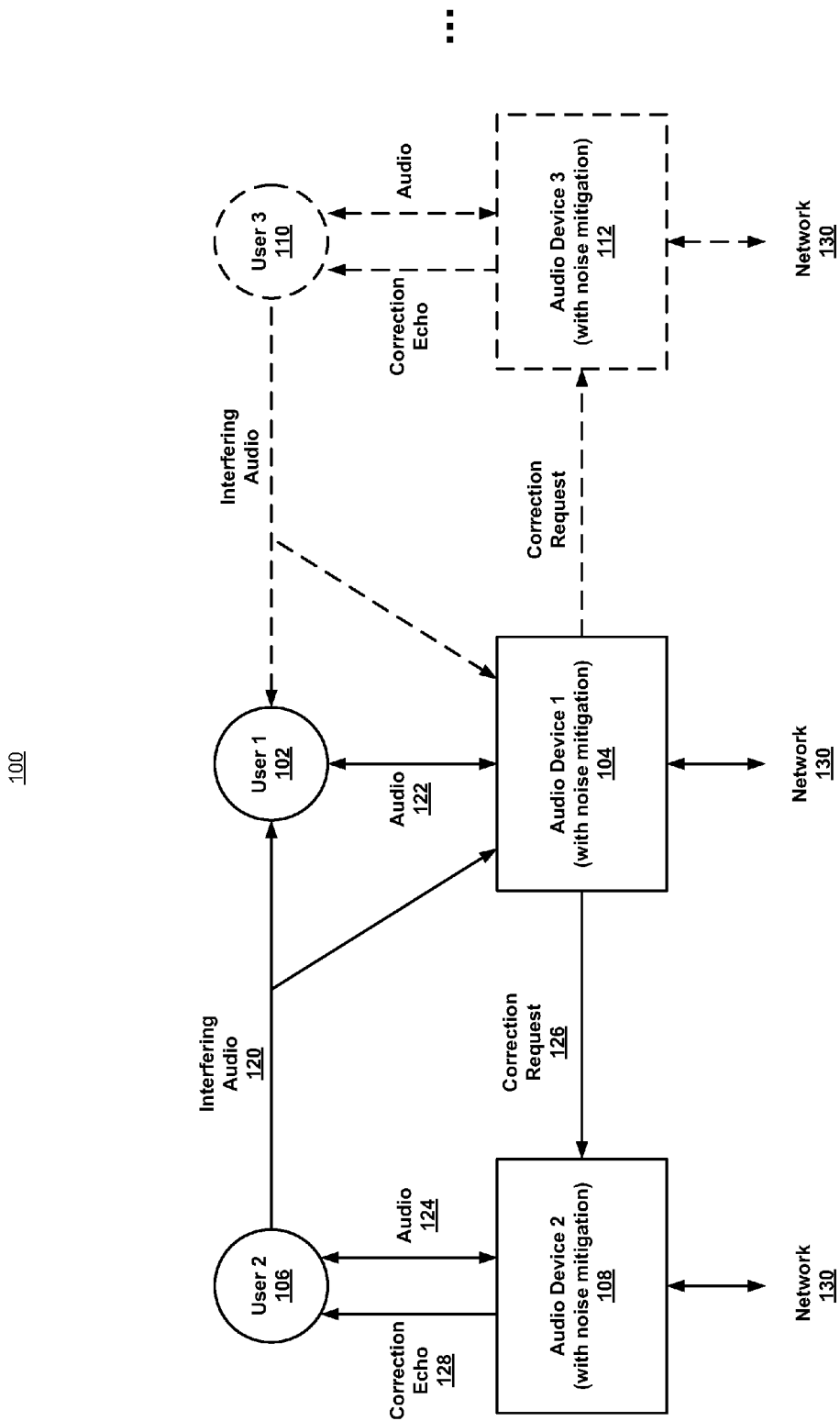
FIG. 1 illustrates a top level system diagram of one example embodiment consistent with the present disclosure.

FIG. 1 illustrates a top level system diagram 100 of one example embodiment consistent with the present disclosure. An audio system is shown to include a number of audio devices configured for noise interference mitigation 104, 108, 112. Each device is associated with a user 102, 106, 110. Although only three devices are shown, for simplicity, it will be appreciated that any number of such devices may be employed in the system. Each device may be employed, for example, as a phone or teleconferencing device by the associated user who engages in a conversation with one or more other (typically remote) parties over a network 130. The audio device may be a smart phone, smart tablet, personal digital assistant (PDA), mobile Internet device (MID), convertible tablet, notebook, laptop computer, workstation, desktop computer, desktop or wall mounted phone system, wearable device or any other device suitable for audio and/or video teleconferencing.

The conversation may occur through an audio stream (e.g., acoustic wave propagation) 122, 124 between the user 102, 106 and the audio device 104, 108 respectively. The audio stream may be unidirectional or bidirectional and may be accomplished through the use of a speaker and/or microphone in the audio device, or an associated headset, as will be explained in greater detail below.

For purposes of the following discussion, it will be considered that user 1 102 is being subjected to audio interference generated by user 2 106. It will be appreciated, however, that these roles may be reversed and that, in some situations, each user may be simultaneously interfering with each other and/or interfering with any of the other users in the system (e.g., user 3 110, etc.), without affecting the principles of operation of the embodiments described below.

The audio stream 124, between user 2 106 and audio device 2 108, includes the voice of user 2. The volume level of user 2's voice may be sufficiently high that it creates an interfering audio signal 120 which has an adverse impact on user 1 102. Audio device 1 104 may be configured to detect this interfering audio 120, identify it as being associated with user 2 106, and send a correction request 126 to audio device 2 108. In response to receiving this correction request 126, audio device 2 108 may generate a correction echo 128 of user 2's voice as a feedback signal to induce user 2 to lower his/her voice, as will be described in greater detail below.

Figure 2:
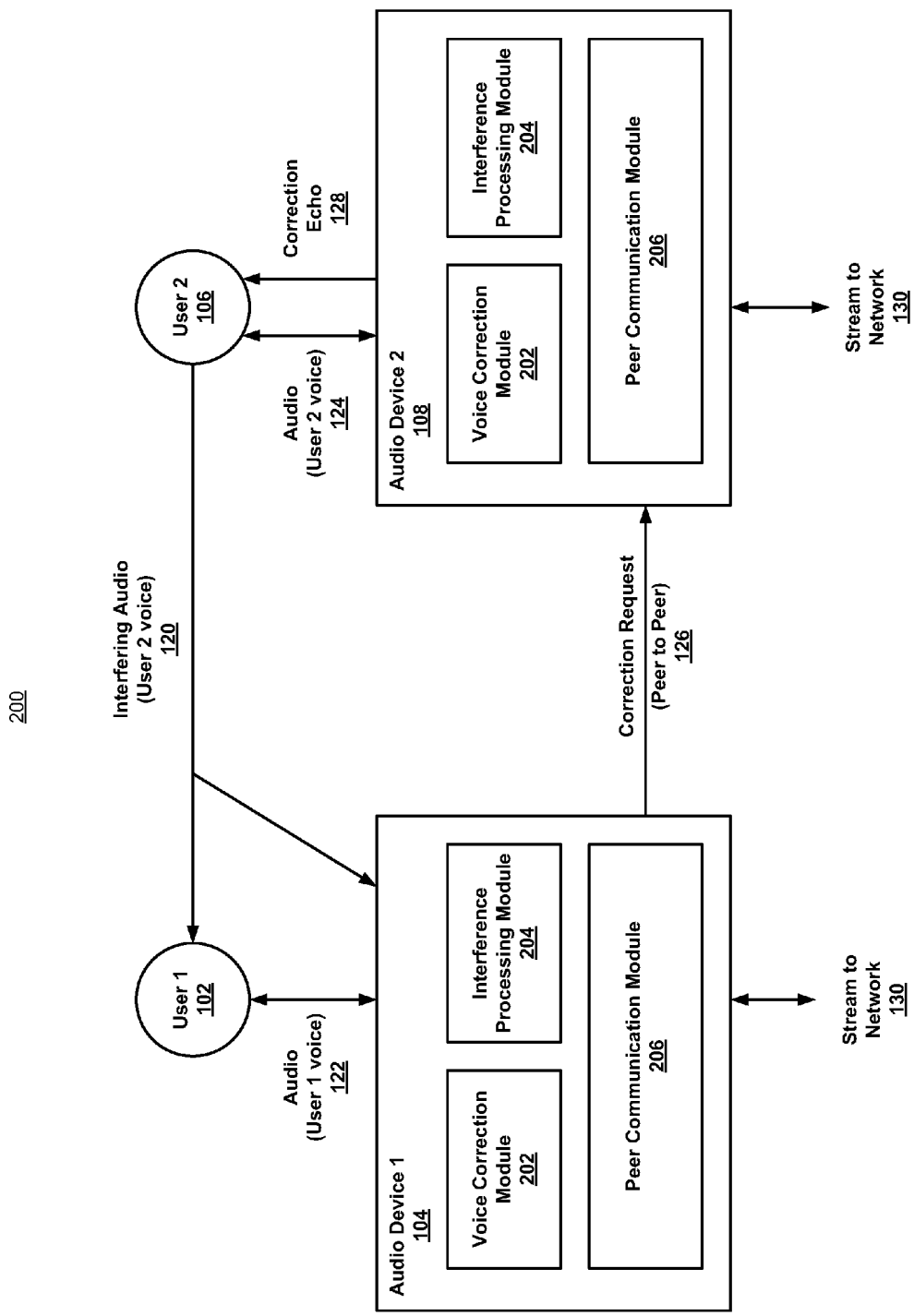
FIG. 2 illustrates a block diagram of an example embodiment consistent with the present disclosure.

FIG. 2 illustrates a block diagram 200 of an example embodiment consistent with the present disclosure. Audio devices 104, 108 are shown, in greater detail, to include voice correction module 202, interference processing module 204 and peer communication module 206 as part of the noise interference mitigation system. Additional components, modules and circuitry (not illustrated) may be included in the audio devices to provide streaming of audio between the user and the network 130 and other parties on the network, whether local or remote. Audio devices 104 and 108 may be configured in a substantially similar manner to each other, at least with respect to operation of the noise interference mitigation components of the system.

Interference processing module 204 may be configured to detect and identify interfering audio from another user of another audio device and to generate a correction request for transmission to that other audio device through peer communication module 206. Peer communication module 206 may also be configured to receive correction requests and provide them to voice correction module 202. In some embodiments, peer communication module 206 may share circuitry and/or functionality with the network interface that is employed to stream audio to the network 130. In some embodiments, peer communication module 206 may be implemented as a separate system employing, for example Wireless Fidelity (WiFi), Bluetooth®, Near Field Communication (NFC), cellular or other local area network (LAN) communications.

Voice correction module may be configured to provide feedback or echo of the voice of the interfering user to that interfering user. The gain or amplitude of the echo may be controlled by the correction request sent by the audio device that is being impacted by the interference and may be proportional to or otherwise related to the degree of impact. The echo is provided to induce the interfering user to lower the volume of his/her voice.

Figure 3:
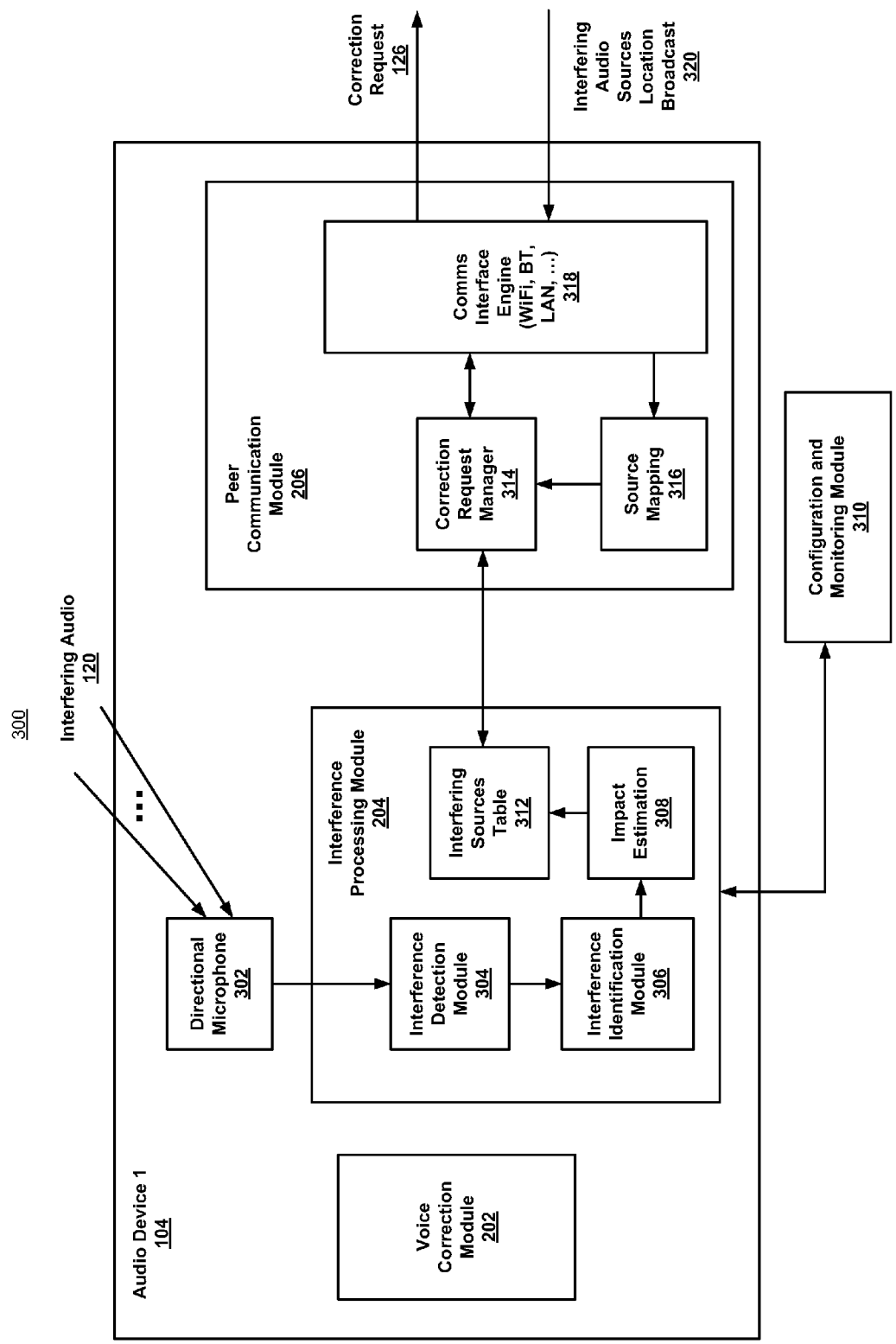
FIG. 3 illustrates a block diagram of another example embodiment consistent with the present disclosure.

FIG. 3 illustrates a block diagram 300 of another example embodiment consistent with the present disclosure. Additional detail is illustrated with regard to the interference processing module 204 and the peer communication module 206 in the context of an audio device 104 that is receiving interfering audio 120 from another user 106. Audio device 104 is shown to include directional microphone(s) 302 which may be configured to receive interfering audio 120 and to provide that audio to interference detection module 304. Interference detection module 304 may include an amplifier, speech filter and/or other components configured to detect speech/voice in the interfering audio and trigger the identification of the source of that interference. It will be appreciated that in some embodiments, for privacy and security purposes, the interfering audio does not need to be recorded or otherwise stored. The system may, for example, perform detection and identification of interfering audio based on amplitude of the interfering signal.

Directional microphone(s) 302 may also be configured to estimate the direction and distance (proximity) of the source of the interfering audio 120. Direction and distance estimation may be accomplished, for example, using beamforming, time difference of arrival, relative signal strength estimation or other suitable techniques. The estimated direction and distance may be used as an offset from the known location of the audio device 104 to estimate the location of the interfering audio source. Interference identification module 306 may be configured to compare the estimated location of the interfering audio source to the known locations of other audio devices in the system, for example audio devices 108, 112, etc. These known locations may be stored in an interfering sources table 312, which will be described in greater detail below with reference to the discussion of FIG. 5.

Impact estimation module 308 may be configured to determine the impact of the interfering voice audio signal 120 on the user 102 of the audio device 104. The impact may be associated with the comfort level of user 102, where, for example, a greater impact may be more likely to cause the user to speak louder. The estimated impact may be based on the volume, persistence, distance, direction and/or any other suitable parameters associated with the interfering audio source. A relatively loud or persistent interfering audio source will generally have a greater impact on the user 102 than a quieter or more intermittent interfering audio source. Impact estimation module 308 may therefore estimate the volume (e.g., signal amplitude) and persistence of each interfering audio source that is detected and store or update these parameters in the interfering sources table 312 so that they may be tracked over time.

Peer communication module 206 is shown to include a correction request manager module 314, a source mapping module 316 and a communication interface engine 318. Correction request manager module 314 may be configured to periodically poll the interfering sources table 312 and select sources to which a correction request will be sent. The sources may be selected based on the estimated impact exceeding a threshold, whether pre-defined or adjustable.

The communication interface engine 318 may be configured to transmit the correction requests 126 and to receive location broadcasts 320 from the other audio devices 108, 112, etc. which are potential interfering audio sources. The location broadcasts 320 may include an anonymous ID associated with that device, which the source mapping module 316 may use as an index into (or search field for) the interfering sources table. The communication interface engine 318 may include a Wireless Fidelity (WiFi) interface, a Bluetooth® interface, a Near Field Communication (NFC) interface, a cellular communications interface and/or a Local Area Network Interface (LAN) to provide communication between devices 104, 108, 112, etc., which may be on a peer to peer level.

The configuration and monitoring module 310 may be configured to provide visual or other indications to the user 102 of the status of the system including information on each of interfering audio sources currently being monitored. The configuration and monitoring module 310 may also enable the user 102 to adjust the impact thresholds or any other operational parameters of the system.

Figure 4:
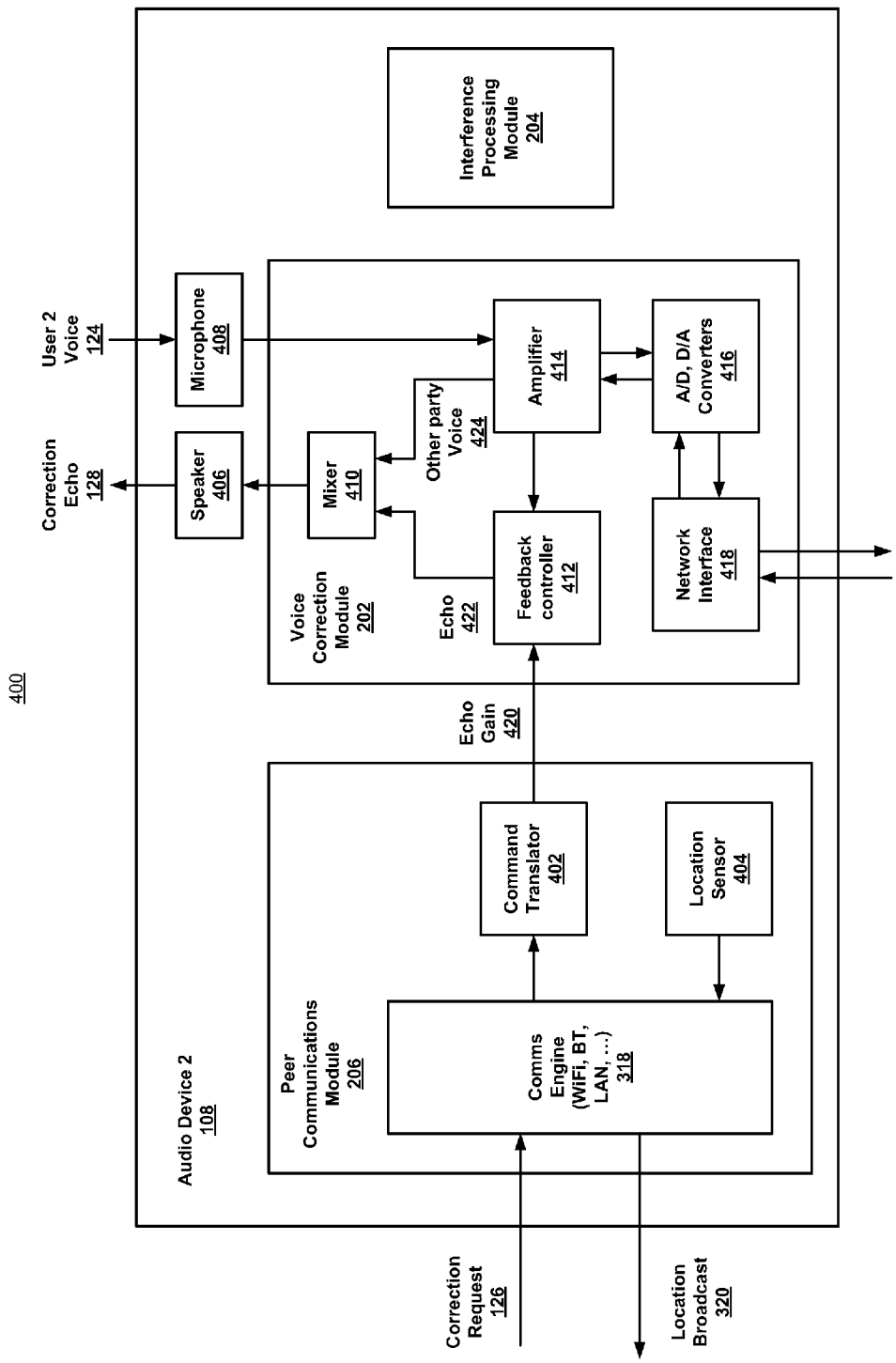
FIG. 4 illustrates a block diagram of another example embodiment consistent with the present disclosure.

FIG. 4 illustrates a block diagram 400 of another example embodiment consistent with the present disclosure. Additional detail is illustrated with regard to the voice correction module 202 and the peer communication module 206 in the context of an audio device 108 associated with a user 106 that is generating interfering audio 120.

Peer communication module 206 is shown to include the communication interface engine 318, a command translator module 402 and a location sensor 404. The location sensor 404 may be configured to determine the location of the audio device 108 and may include a Global Positioning Sensor (GPS) or other circuitry capable of estimating location. In some embodiments, the location may be entered by a user or provided through system configuration operations. The location may be provided to the communication interface engine 318 for transmission or broadcast to other audio devices 104, 112 in the system such that each audio device can store information (including location) about the other devices, which may be potential interference sources at some point in time.

The communication interface engine 318 may be configured to transmit the location broadcasts 320 and to receive correction requests 126 from the other audio devices 104, 112, etc. which are potential interfering audio sources. The location broadcasts 320 may include an anonymous ID associated with the device 108. The anonymous ID may then be used by the other devices 104, 112 to reference this device 108. The communication interface engine 318 may include a Wireless Fidelity (WiFi) interface, a Bluetooth® interface, a Near Field Communication (NFC) interface, a cellular communications interface and/or a Local Area Network Interface (LAN) to provide communication between devices 104, 108, 112, etc., which may be on a peer to peer level.

The command translator module 402 may be configured to translate the received correction request into a gain value 420 that may be used by the voice correction module 202 to generate the correction echo.

During normal operation of audio device 108 (e.g., when not performing the correction function), user 2's voice 124 may be picked up by microphone 408. The voice 124 may then be amplified by amplifier 414, converted from an analog signal to a digital signal by A/D converter 416 and provided to network interface 418 for transmission over network 130 to another user or party, whether local or remote. Similarly, for the other side of the conversation, a signal from the other party is received from the network by network interface 418, converted back to an analog signal by D/A converter 416 and provided to speaker 406 so that user 124 can hear the other party's voice 424. In some embodiments, speaker 406 may be an earphone. Speaker 406 and microphone 408 may also be incorporated into a headset configured to be worn by the user.

When a correction request 126 is received and translated, correction feedback may be generated. The feedback controller module 412 may be configured to feedback user 2's voice 124, for example by tapping into amplifier 414 or any other suitable point, and apply an echo gain 420. The resulting echo signal 422 may be then be provided to mixer 410 which is configured to mix the echo signal with the other party's voice signal 424 and provide the mixed signal to speaker 406 so that user 2 may hear the other party and the corrective feedback echo. The feedback echo may then induce user 2 to lower his/her voice to reduce interference to other users.

Although the mixing, as shown here, is performed in the analog domain, it will be appreciated that in some embodiments, any of the operations described herein, including mixing, may be performed in the digital domain.

In some embodiments, the correction request signal 126 may be sent to a wearable device, such as for example a wristwatch or the like, which may be configured to provide a feedback signal to the interfering user that includes a vibration, an audio beep and/or a visual cue.

FIG. 5 illustrates a table of interfering sources 500 consistent with another example embodiment of the present disclosure. Information associated with each of the interfering sources may be stored in a table or other suitable database (e.g., interfering sources table 312). Each interfering source may be assigned an ID such as, for example source ID 502 which may represent a sequential numbering of entries in the table or conform to any other convenient numbering scheme. The table may also store the volume 504 and persistence 506 of the interfering sources, which may be expressed as a percentage of a maximum value or in any other suitable form. The estimated location 508 of each source, as determined for example with the aid of directional microphones 302, may also be stored. An estimated proximity 510 of the source may also be stored. The proximity may be expressed in units of distance (e.g., feet, meters, etc.) or in a relative measure format. The calculated impact 512 of the source may also be stored, for example, as a relative measure such as zero to 100, where zero represents no impact and 100 represents a maximum interference impact. The broadcast (anonymous) ID 514 of the interfering source may also be stored. The broadcast ID 514 may be represented in any convenient form: numeric, alphanumeric, etc. In this example, the first interfering source is referenced as "PC-1," the second as "PC-2" and the third as "Phone-7." The reported or broadcast location 516 is also stored in the table.

Figure 6:
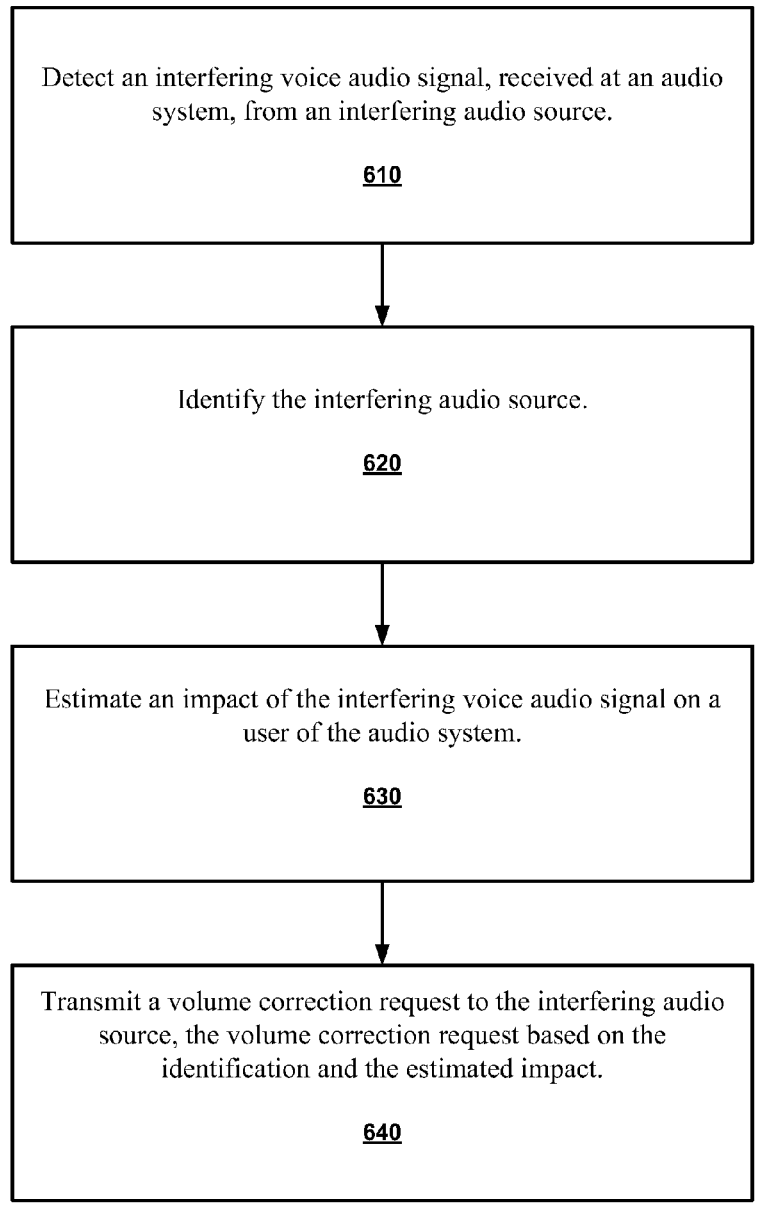
FIG. 6 illustrates a flowchart of operations of one example embodiment consistent with the present disclosure.

FIG. 6 illustrates a flowchart of operations 600 of another example embodiment consistent with the present disclosure. The operations provide a method for noise interference mitigation of an audio device. At operation 610, an interfering voice audio signal, received at the audio device, from an interfering audio source, is detected. At operation 620, the interfering audio source is identified. At operation 630, an impact of the interfering voice audio signal on a user of the audio device is estimated. At operation 640, a volume correction request is transmitted to the interfering audio source. The volume correction request is based on the identification and the estimated impact.

Figure 7:
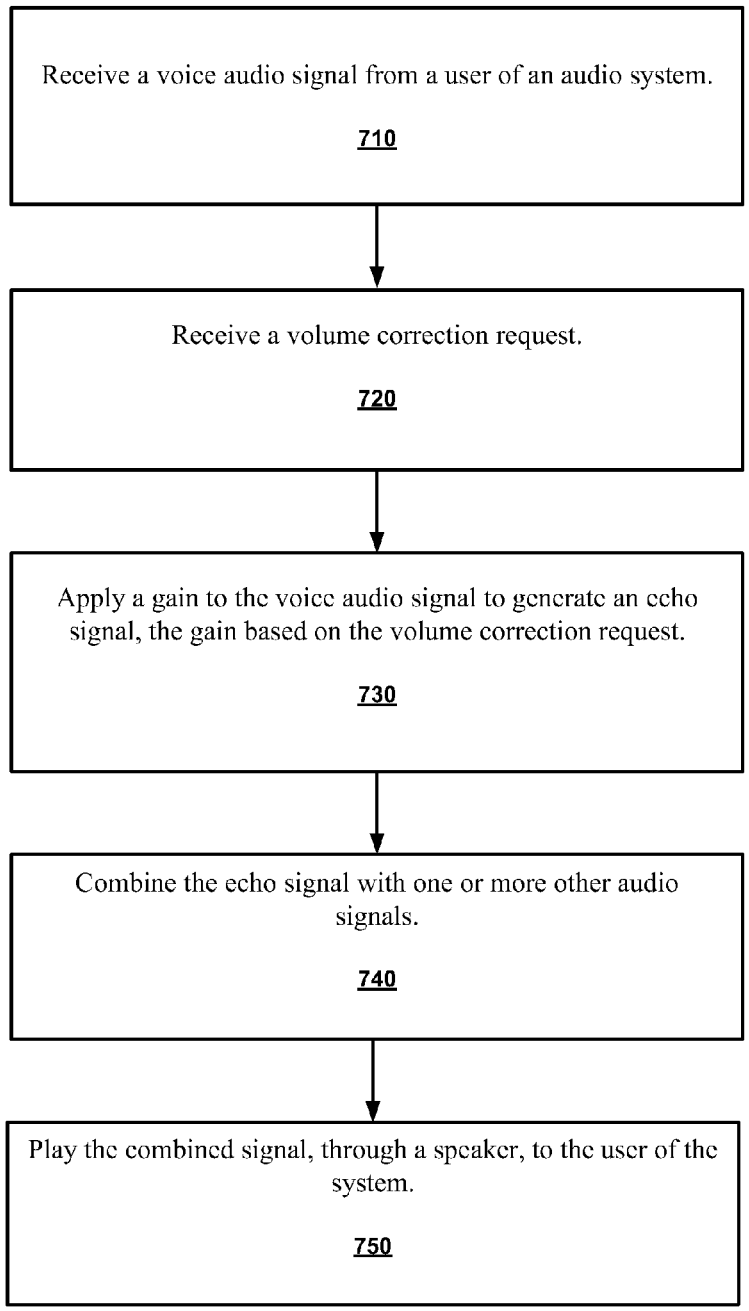
FIG. 7 illustrates a flowchart of operations of another example embodiment consistent with the present disclosure.

FIG. 7 illustrates a flowchart of operations 700 of another example embodiment consistent with the present disclosure. The operations provide a method for noise interference mitigation of an audio device. At operation 710, a voice audio signal is received from a user of the device. At operation 720, a volume correction request is received. At operation 730, a gain is applied to the voice audio signal to generate an echo signal. The gain is based on the volume correction request. At operation 740, the echo signal is combined with one or more other audio signals. At operation 750, the combined signal is played through a speaker to the user of the device.

Figure 8:
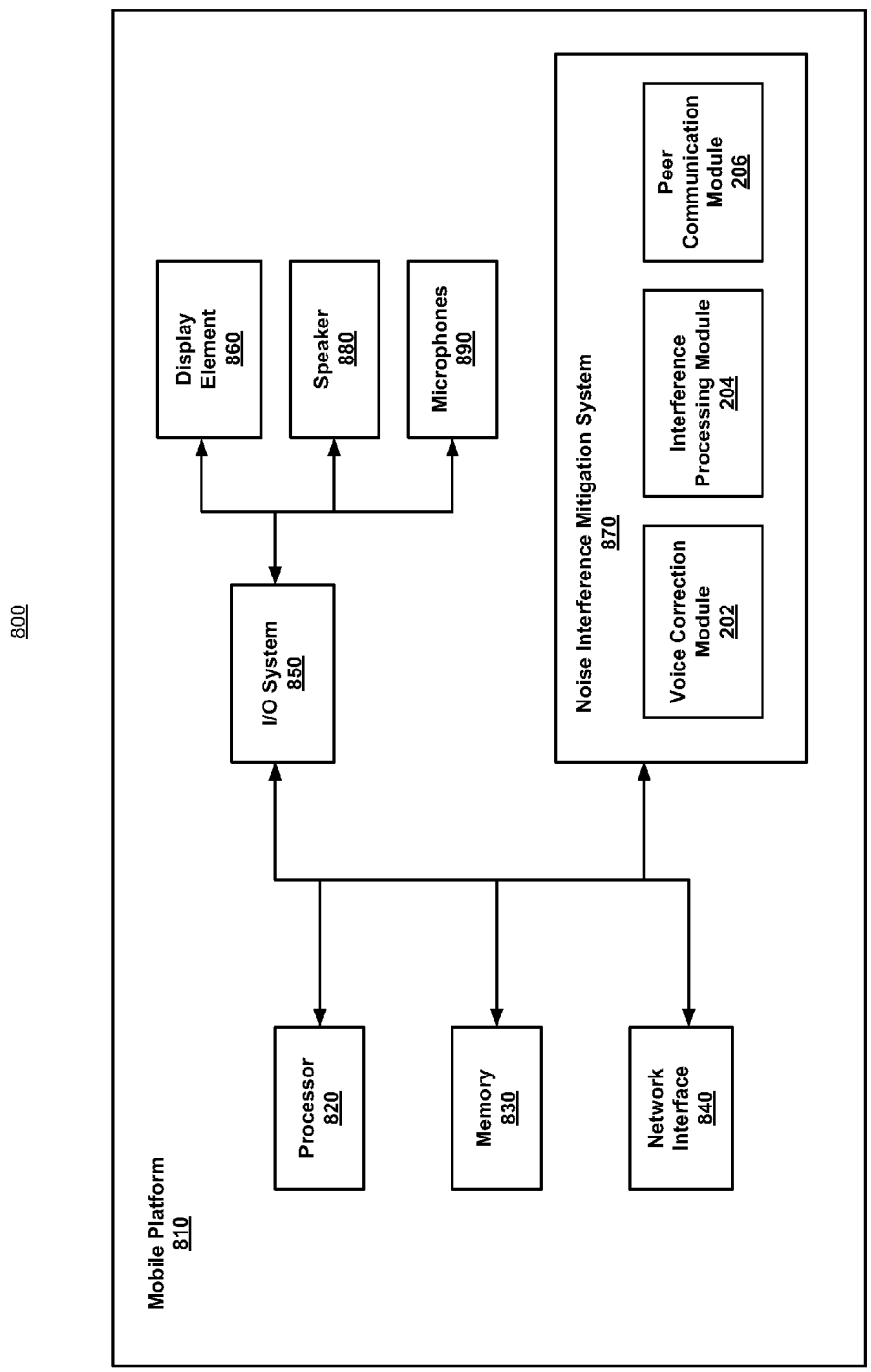
FIG. 8 illustrates a system diagram of a platform of another example embodiment consistent with the present disclosure.

FIG. 8 illustrates a system diagram 800 of one example embodiment consistent with the present disclosure. The system 800 may be a mobile platform 810 or computing device such as, for example, a smart phone, smart tablet, personal digital assistant (PDA), mobile Internet device (MID), convertible tablet, notebook or laptop computer, or any other suitable device. It will be appreciated, however, that embodiments of the system described herein are not limited to mobile platforms, and in some embodiments, the system 800 may be a workstation, desktop computer, desktop phone system or any device suitable for audio and/or video teleconferencing. The device may generally present various interfaces to a user via a display element 860 such as, for example, a touch screen, liquid crystal display (LCD) or any other suitable display type.

The system 800 is shown to include a processor 820. In some embodiments, processor 820 may be implemented as any number of processor cores. The processor (or processor cores) may be any type of processor, such as, for example, a micro-processor, an embedded processor, a digital signal processor (DSP), a network processor, a field programmable gate array or other device configured to execute code. Processor 820 may be a single-threaded core or, a multi-threaded core in that it may include more than one hardware thread context (or "logical processor") per core. System 800 is also shown to include a memory 830 coupled to the processor 820. The memory 830 may be any of a wide variety of memories (including various layers of memory hierarchy and/or memory caches) as are known or otherwise available to those of skill in the art. It will be appreciated that processor 820 and memory 830 may be configured to store, host and/or execute one or more user applications or other software modules. These applications may include, but not be limited to, for example, any type of computation, communication, data management, data storage and/or user interface task. In some embodiments, these applications may employ or interact with any other components of the mobile platform 810.

System 800 is also shown to include network interface module 840 which may include wireless communication capabilities, such as, for example, cellular communications, Wireless Fidelity (WiFi), Bluetooth®, and/or Near Field Communication (NFC). The wireless communications may conform to or otherwise be compatible with any existing or yet to be developed communication standards including past, current and future version of Bluetooth®, Wi-Fi and mobile phone communication standards.

System 800 is also shown to include an input/output (IO) system or controller 850 which may be configured to enable or manage data communication between processor 820 and other elements of system 800 or other elements (not shown) external to system 800.

System 800 is also shown to include noise interference mitigation system 870, including voice correction module 202, interference processing module 204 and peer communication module 206, as described previously. In some embodiments, peer communication module 206 may share functionality with network interface 840. System 800 may also include one or more speakers 880 and microphones 890, which may further include directional microphones. In some embodiments, speakers 880 may be earphones. In some embodiments, speakers 880 and microphones 890 may be incorporated in a headset configured to be worn by the user.

It will be appreciated that in some embodiments, the various components of the system 800 may be combined in a system-on-a-chip (SoC) architecture. In some embodiments, the components may be hardware components, firmware components, software components or any suitable combination of hardware, firmware or software.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as, for example, processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may include, for example, singly or in any combination, hard-wired circuitry, programmable circuitry, state machine circuitry, and/or firmware that stores instructions executed by programmable circuitry. An app may be embodied as code or instructions which may be executed on programmable circuitry such as a host processor or other programmable circuitry. A module, as used in any embodiment herein, may be embodied as circuitry. The circuitry may be embodied as an integrated circuit, such as an integrated circuit chip.

Thus, the present disclosure provides systems, devices, methods and computer readable media for noise interference mitigation. The following examples pertain to further embodiments.

According to Example 1 there is provided an audio device with noise interference mitigation. The device may include an interference detection module to detect an interfering voice audio signal received from an interfering audio source. The device of this example may also include an interference identification module to identify the interfering audio source. The device of this example may further include an impact estimation module to estimate an impact of the interfering voice audio signal on a user of the audio device. The device of this example may further include a communication module to transmit a volume correction request to the interfering audio source, the volume correction request based on the identification and the estimated impact.

Example 2 may include the subject matter of Example 1, and the impact estimation module may further be configured to measure volume and persistence of the interfering voice audio signal, and to estimate distance between the audio device and the interfering audio source, and the estimated impact is based on the measured volume, the measured persistence and/or the estimated distance.

Example 3 may include the subject matter of any of Examples 1 and 2, and the communication module is further configured to receive a location broadcast, the location broadcast including a location associated with the interfering audio source, and the estimated impact is further based on the location.

Example 4 may include the subject matter of any of Examples 1-3, and further include a directional microphone to estimate a direction of the interfering audio source, and the estimated impact is further based on the estimated direction.

Example 5 may include the subject matter of any of Examples 1-4, and further include a user interface to provide monitoring of the interfering audio source and adjustment of the estimated impact, by a user of the device.

Example 6 may include the subject matter of any of Examples 1-5, and the communication module includes a Wireless Fidelity (WiFi) interface, a Bluetooth® interface, a Near Field Communication (NFC) interface, a cellular communications interface, or a Local Area Network Interface (LAN).

Example 7 may include the subject matter of any of Examples 1-6, and the device is a smart phone, smart tablet, notebook or laptop computer.

According to Example 8 there is provided an audio device with noise interference mitigation. The device may include a microphone to receive a voice audio signal from a user of the device. The device of this example may also include a communication module to receive a volume correction request. The device of this example may further include a feedback controller to apply a gain to the voice audio signal to generate an echo signal, the gain based on the volume correction request. The device of this example may further include a mixer circuit to combine the echo signal with one or more other audio signals. The device of this example may further include a speaker to provide the combined signal from the mixer circuit to the user of the device.

Example 9 may include the subject matter of Example 8, and further include a network interface to receive the one or more other audio signals, and the one or more other audio signals are associated with participants of a conversation with the user.

Example 10 may include the subject matter of any of Examples 8 and 9, and further include a location sensor to determine a location of the device.

Example 11 may include the subject matter of any of Examples 8-10, and the communication module is further to broadcast the location of the device.

Example 12 may include the subject matter of any of Examples 8-11, and the communication module includes a Wireless Fidelity (WiFi) interface, a Bluetooth® interface, a Near Field Communication (NFC) interface, a cellular communications interface, or a Local Area Network Interface (LAN).

Example 13 may include the subject matter of any of Examples 8-12, and the device is a smart phone, smart tablet, notebook or laptop computer.

According to Example 14 there is provided a method for noise interference mitigation. The method may include detecting an interfering voice audio signal received from an interfering audio source. The method of this example may also include identifying the interfering audio source. The method of this example may further include estimating an impact of the interfering voice audio signal on a user of the audio device. The method of this example may further include transmitting a volume correction request to the interfering audio source, the volume correction request based on the identification and the estimated impact.

Example 15 may include the subject matter of Example 14, and further includes measuring volume and persistence of the interfering voice audio signal; and estimating distance between the audio device and the interfering audio source, and the impact estimation is based on the measured volume, the measured persistence and/or the estimated distance.

Example 16 may include the subject matter of any of Examples 14 and 15, and further includes receiving a location broadcast including a location associated with the interfering audio source, and the impact estimation is further based on the location.

Example 17 may include the subject matter of any of Examples 14-16, and further includes employing a directional microphone to estimate a direction of the interfering audio source, and the impact estimation is further based on the estimated direction.

Example 18 may include the subject matter of any of Examples 14-17, and further includes providing a user interface for monitoring of the interfering audio source and adjustment of the impact estimation, by a user of the device.

Example 19 may include the subject matter of any of Examples 14-18, and the volume correction request is transmitted over a Wireless Fidelity (WiFi) interface, a Bluetooth® interface, a Near Field Communication (NFC) interface, a cellular communications interface, or a Local Area Network Interface (LAN).

According to Example 20 there is provided a method for noise interference mitigation. The method may include receiving a voice audio signal from a user of the device. The method of this example may also include receiving a volume correction request. The method of this example may further include applying a gain to the voice audio signal to generate an echo signal, the gain based on the volume correction request. The method of this example may further include combining the echo signal with one or more other audio signals. The method of this example may further include playing the combined signal, through a speaker, to the user of the device.

Example 21 may include the subject matter of Example 20, and further includes receiving the one or more other audio signals through a network interface, and the one or more other audio signals are associated with participants of a conversation with the user.

Example 22 may include the subject matter of any of Examples 20 and 21, and further includes determining a location of the device and broadcasting the location of the device.

Example 23 may include the subject matter of any of Examples 20-22, and the volume correction request is received over a Wireless Fidelity (WiFi) interface, a Bluetooth® interface, a Near Field Communication (NFC) interface, a cellular communications interface, or a Local Area Network Interface (LAN).

According to Example 24 there is provided a system for noise interference mitigation. The system may include means for detecting an interfering voice audio signal received from an interfering audio source. The system of this example may also include means for identifying the interfering audio source. The system of this example may further include means for estimating an impact of the interfering voice audio signal on a user of the audio device. The system of this example may further include means for transmitting a volume correction request to the interfering audio source, the volume correction request based on the identification and the estimated impact.

Example 25 may include the subject matter of Example 24, and further includes means for measuring volume and persistence of the interfering voice audio signal; and means for estimating distance between the audio device and the interfering audio source, and the impact estimation is based on the measured volume, the measured persistence and/or the estimated distance.

Example 26 may include the subject matter of any of Examples 24 and 25, and further includes means for receiving a location broadcast including a location associated with the interfering audio source, and the impact estimation is further based on the location.

Example 27 may include the subject matter of any of Examples 24-26, and further includes means for employing a directional microphone to estimate a direction of the interfering audio source, and the impact estimation is further based on the estimated direction.

Example 28 may include the subject matter of any of Examples 24-27, and further includes means for providing a user interface for monitoring of the interfering audio source and adjustment of the impact estimation, by a user of the device.

Example 29 may include the subject matter of any of Examples 24-28, and the volume correction request is transmitted over a Wireless Fidelity (WiFi) interface, a Bluetooth® interface, a Near Field Communication (NFC) interface, a cellular communications interface, or a Local Area Network Interface (LAN).

According to Example 30 there is provided a system for noise interference mitigation. The system may include means for receiving a voice audio signal from a user of the device. The system of this example may also include means for receiving a volume correction request. The system of this example may further include means for applying a gain to the voice audio signal to generate an echo signal, the gain based on the volume correction request. The system of this example may further include means for combining the echo signal with one or more other audio signals. The system of this example may further include means for playing the combined signal, through a speaker, to the user of the device.

Example 31 may include the subject matter of Example 30, and further includes means for receiving the one or more other audio signals through a network interface, and the one or more other audio signals are associated with participants of a conversation with the user.

Example 32 may include the subject matter of any of Examples 30 and 31, and further includes means for determining a location of the device and broadcasting the location of the device.

Example 33 may include the subject matter of any of Examples 30-32, and the volume correction request is received over a Wireless Fidelity (WiFi) interface, a Bluetooth® interface, a Near Field Communication (NFC) interface, a cellular communications interface, or a Local Area Network Interface (LAN).

According to another example there is provided at least one computer-readable storage medium having instructions stored thereon which when executed by a processor, cause the processor to perform the operations of the method as described in any of the aforementioned examples 14-23.

According to another example there is provided an apparatus including means to perform a method as described in any of the aforementioned examples 14-23.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A first audio device with noise interference mitigation, said first audio device comprising:
    a microphone to provide a voice audio signal from a user of said first audio device to a network interface for transmission to a second audio device;
    a communication module to receive a volume correction request from a third audio device that is not in voice communication with the first audio device;
    a feedback controller to apply a gain to said voice audio signal to generate an echo signal, said gain based on said volume correction request;
    a mixer circuit to combine said echo signal with one or more other audio signals from said second audio device; and
    a speaker to provide said combined signal from said mixer circuit to said user of said first audio device.

2. The first audio device of claim 1, wherein said one or more other audio signals are associated with participants of a conversation with said user.

3. The first audio device of claim 1, further comprising a location sensor to determine a location of said first audio device.

4. The audio device of claim 3, wherein said communication module is further to broadcast said location of said first audio device and an anonymous identifier for said first audio device.

5. A non-transitory computer-readable storage medium having instructions stored thereon which when executed by a processor result in the following operations for noise interference mitigation of a first audio device, said operations comprising:
    receiving a voice audio signal from a user of said first audio device;
    providing said voice audio signal to a network interface for transmission to a second audio device;
    receiving a volume correction request from a third audio device that is not in voice communication with the first audio device;
    applying a gain to said voice audio signal to generate an echo signal, said gain based on said volume correction request;
    combining said echo signal with one or more other audio signals from said second audio device; and
    playing said combined signal, through a speaker, to said user of said first audio device.

6. The non-transitory computer-readable storage medium of claim 5, wherein said one or more other audio signals are associated with participants of a conversation with said user.

7. The non-transitory computer-readable storage medium of claim 5, further comprising the operations of determining a location of said first audio device and broadcasting said location of said first audio device and an anonymous identifier of said first audio device.

8. A method for noise interference mitigation of first audio device, said method comprising:
    receiving a voice audio signal from a user of said first audio device;
    providing said voice audio signal to a network interface for transmission to a second audio device;
    receiving a volume correction request from a third audio device that is not in voice communication with the first audio device;
    applying a gain to said voice audio signal to generate an echo signal, said gain based on said volume correction request;
    combining said echo signal with one or more other audio signals from said second audio device; and
    playing said combined signal, through a speaker, to said user of said first audio device.

9. The method of claim 8, wherein said one or more other audio signals are associated with participants of a conversation with said user.

10. The method of claim 8, further comprising determining a location of said first audio device and broadcasting said location of said audio device and an anonymous identifier of said first audio device.

\* \* \* \* \*